(12) United States Patent
Hashii et al.

(10) Patent No.: US 11,019,756 B2
(45) Date of Patent: May 25, 2021

(54) POWER CONVERSION DEVICE

(71) Applicant: Mitsubishi Electric Corporation, Tokyo (JP)

(72) Inventors: Naoya Hashii, Tokyo (JP); Yoshifumi Mizuno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 59 days.

(21) Appl. No.: 16/496,507

(22) PCT Filed: Apr. 20, 2017

(86) PCT No.: PCT/JP2017/015921
§ 371 (c)(1),
(2) Date: Sep. 23, 2019

(87) PCT Pub. No.: WO2018/193588
PCT Pub. Date: Oct. 25, 2018

(65) Prior Publication Data
US 2021/0112689 A1 Apr. 15, 2021

(51) Int. Cl.
*H05K 7/20* (2006.01)
*H05K 7/14* (2006.01)
(Continued)

(52) U.S. Cl.
CPC ..... *H05K 7/20927* (2013.01); *H01L 23/4006* (2013.01); *H01L 23/42* (2013.01);
(Continued)

(58) Field of Classification Search
CPC .......... H05K 7/20218; H05K 7/20254; H05K 7/20263; H05K 7/20272; H05K 7/2039;
(Continued)

(56) References Cited

U.S. PATENT DOCUMENTS 5,821,617 A 10/1998 Autry et al.
5,966,291 A * 10/1999 Baumel .............. H05K 7/20927
165/80.3
(Continued)

FOREIGN PATENT DOCUMENTS

CN 106505837 A 3/2017
EP 2 346 152 A1 7/2011
(Continued)

OTHER PUBLICATIONS

Extended European Search Report dated Mar. 27, 2020 in European Application No. 17905941.5.
(Continued)

*Primary Examiner* — Zachary Pape
*Assistant Examiner* — Amir A Jalali
(74) *Attorney, Agent, or Firm* — Sughrue Mion, PLLC; Richard C. Turner

(57) ABSTRACT

Provided is a power conversion device including: power semiconductor elements, a support case, a heat sink, in which a plurality of boss portions are formed; a smoothing capacitor including a case member having a plurality of leg portions; and a bus bar configured to connect the smoothing capacitor and the DC input terminal, wherein, in the power conversion device in which the plurality of leg portions of the case member being respectively fixed to the plurality of boss portions of the heat sink, wherein materials and dimensions of the respective boss portions, the respective leg portions, the support case, and the bus bar are determined so that a total thermal expansion/contraction amount of the respective boss portions and the respective leg portions falls within a range of 0.9 to 1.1 relative to a total thermal expansion/contraction amount of the support case and the bus bar.

19 Claims, 5 Drawing Sheets

(51) Int. Cl.
   *H02M 7/48*     (2007.01)
   *H01L 23/42*    (2006.01)
   *H01L 23/40*    (2006.01)
   *H01L 25/07*    (2006.01)
   *H02M 7/00*     (2006.01)
   *H01L 23/473*   (2006.01)

(52) U.S. Cl.
   CPC .......... *H01L 25/072* (2013.01); *H02M 7/003* (2013.01); *H02M 7/48* (2013.01); *H05K 7/1432* (2013.01); *H05K 7/2039* (2013.01); *H01L 23/473* (2013.01); *H01L 2023/4062* (2013.01); *H01L 2023/4087* (2013.01)

(58) Field of Classification Search
   CPC .......... H05K 7/20927–20936; H05K 7/20445; H05K 7/20509; H05K 7/06; H05K 7/1432; H05K 7/48; H05K 2201/10416; H01L 23/3672; H01L 23/473; H01L 23/42; H01L 23/4006; H01L 24/00; H01L 24/33
   See application file for complete search history.

(56) References Cited

U.S. PATENT DOCUMENTS

| | | | |
|---|---|---|---|
| 7,492,594 B2 | 2/2009 | Pal | |
| 10,420,256 B1* | 9/2019 | Nakamura | ......... H05K 7/20254 |
| 2002/0195262 A1* | 12/2002 | Kirchberger | .......... H02M 7/003 174/521 |
| 2013/0277820 A1* | 10/2013 | Hotta | ................. H01L 23/4006 257/712 |
| 2013/0301220 A1* | 11/2013 | Hotta | ................. H05K 7/20218 361/699 |
| 2013/0308257 A1* | 11/2013 | Kosugi | .................... H05K 7/12 361/679.01 |
| 2014/0246768 A1* | 9/2014 | Soyano | ................... H05K 13/00 257/691 |
| 2015/0216089 A1* | 7/2015 | Tanaka | .................. H01L 23/473 361/699 |
| 2015/0289356 A1* | 10/2015 | Izuo | ........................ H01L 23/13 361/709 |
| 2016/0381823 A1* | 12/2016 | Ye | .......................... H05K 1/181 361/736 |
| 2017/0018884 A1* | 1/2017 | Hayase | .................. H01R 43/24 |
| 2017/0305456 A1* | 10/2017 | Iwabuki | ............... H05K 5/0043 |
| 2020/0259290 A1* | 8/2020 | Hashii | .................. H01R 12/716 |

FOREIGN PATENT DOCUMENTS

| | | |
|---|---|---|
| JP | 2011-163148 A | 8/2011 |
| KR | 10-1466032 B1 | 11/2014 |

OTHER PUBLICATIONS

International Search Report for PCT/JP2017/015921, dated Jul. 18, 2017.

* cited by examiner

POWER CONVERSION DEVICE

CROSS REFERENCE TO RELATED APPLICATIONS

This application is a National Stage of International Application No. PCT/JP2017/015921 filed Apr. 20, 2017.

TECHNICAL FIELD

The present invention relates to a power conversion device having a mounting mechanism for a smoothing capacitor, which is not affected by a difference in thermal shrinkage amount between the smoothing capacitor and a housing configured to receive the smoothing capacitor.

BACKGROUND ART

In recent years, development and marketing of vehicles such as electric vehicles, hybrid vehicles, and fuel-cell vehicles have been rapidly advanced from the viewpoints of environmental protection and high fuel efficiency. Those vehicles are electrically powered unlike the related-art vehicles that are powered by an internal combustion engine. In those vehicles, a power conversion device configured to convert electricity to power is mounted.

The power conversion device includes a housing that holds therein a water-cooled heat sink, a control circuit board, a step-up converter, and other such components. The water-cooled heat sink is adapted to cool a heat generating element, for example, a switching element. The housing further includes a smoothing capacitor configured to control a ripple current, a power supply connection terminal block, a motor connection terminal block, and other such components. Those components are electrically connected together via a high- or low-voltage bus bar or a high- or low-voltage harness.

The power conversion device thus equipped with many components is required to satisfy requirements for size reduction, weight reduction, cost, reduction, high vibration resistance, and ease of assembly. For that purpose, the following configuration is proposed. That is, the individual components are attached to a housing and a cover member, which constitute a structural member. The cover member is fastened to the housing and then electrically connected thereto via a service hole formed in the housing (see Patent Literature 1, for example).

Further, in order to achieve a high power output power conversion device, the smoothing capacitor is required to have a large capacity and withstand nigh voltage. In order to increase a capacity of the power conversion device, it is required to increase the number of capacitor elements or increase a size thereof. Further, in order to increase a withstand voltage of the power conversion device, it is required to increase a thickness of an insulating resin applied to cover the capacitor elements. For that purpose, a large case member is required for the smoothing capacitor.

Citation List

Patent Literature

[PTL 1] JP 2011-163148 A

SUMMARY OF INVENTION

Technical Problem

However, when fixing a large smoothing capacitor to an inner wall of a metal housing, there is a difference in linear expansion coefficient between the metal housing and the smoothing capacitor, and hence stress is concentratedly applied between resin leg portions provided to fix the smoothing capacitor to the housing. The concentrated stress may possibly cause a fatigue fracture of the resin leg portions or loosening of a screw. Further, when a vehicle drives through a puddle of water with a power conversion device being at high temperature, there is a risk of the metal housing thereof being rapidly cooled by a large quantity of splashed water. Under such circumstances, a difference in thermal shrinkage amount between the housing and the smoothing capacitor is further increased due to a difference in thermal transfer coefficient and a difference in heat capacity in addition to the difference in linear expansion coefficient between the housing and the smoothing capacitor.

The present, invention has been made with a view to solving the above-mentioned problems. The present invention relates to a power conversion device having a mounting mechanism for a smoothing capacitor, which is not affected by the difference in thermal shrinkage amount between the smoothing capacitor and the housing configured to receive the smoothing capacitor.

Solution to Problem

According to one embodiment of the present invention, there is provided a power conversion device including, in a housing: power semiconductor elements; a support case, to which a DC input terminal and an AC output terminal are attached, the DC input terminal and the AC output terminal being connected to the power semiconductor elements, a heat sink, in which a plurality of boss portions are formed on an upper surface thereof, and to which the power semiconductor elements and the support case are attached; a smoothing capacitor including a case member having a plurality of leg portions; and a bus bar configured to connect the smoothing capacitor and the DC input terminal, wherein, in the power conversion device in which the plurality of leg portions of the case member of the smoothing capacitor being respectively fixed to the plurality of boss portions of the heat sink, materials and dimensions of the respective boss portions, the respective leg portions, the support case, and the bus bar are determined so that a total thermal expansion/contraction amount of the respective boss portions and the respective leg portions falls within a range of from 0.9 to 1.1 relative to a total thermal expansion/contraction amount of the support case and the bus bar.

Advantageous Effects of Invention

According to the power conversion device of the present invention, the smoothing capacitor is supported not to come into direct contact with the housing so as to prevent the smoothing capacitor from being rapidly cooled even in such a situation that the housing is likely to rapidly cool from a high-temperature state. This configuration enables a power conversion device that causes no fatigue fracture of the leg portions of the case member configured to support the smoothing capacitor and also causes no loosening of a screw used to fix the case member.

DESCRIPTION OF EMBODIMENTS

Now, with reference to the drawings, a power conversion device according to exemplary embodiments of the present invention is described.

First Embodiment

Figure 1:
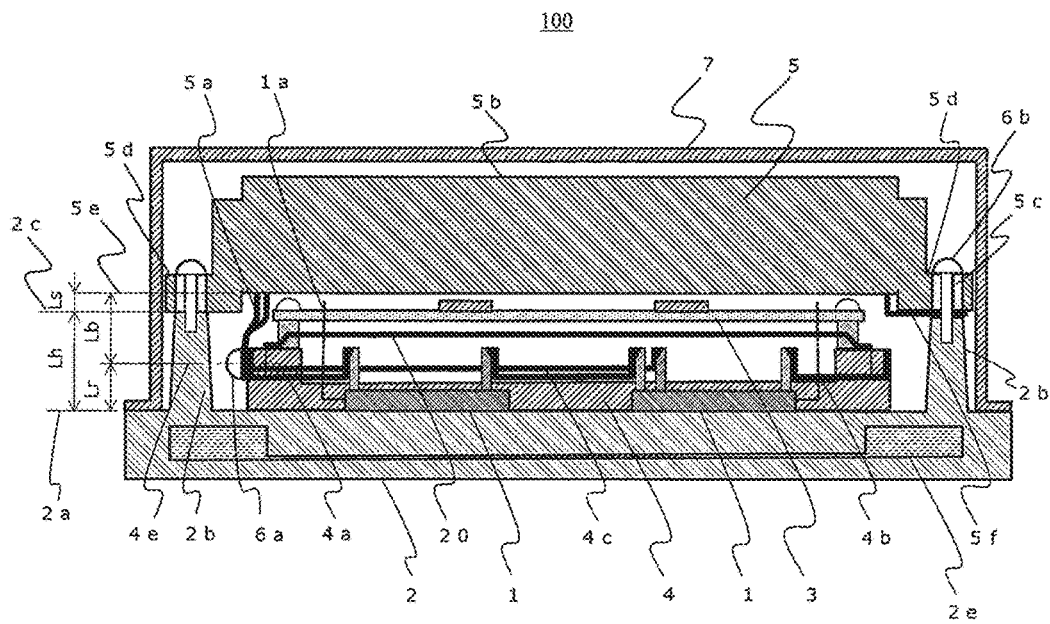
FIG. 1 is a vertical sectional view for illustrating a power conversion device according to a first embodiment of the present invention.

FIG. 1 is a configuration view for illustrating a power conversion device 100 according to a first embodiment of the present invention. As illustrated in FIG. 1, the power conversion device 100 of the first embodiment includes a housing 7 fixed onto an upper surface 2a of a water-cooled heat sink 2 having a cooling water passage 2e. The power conversion device 100 includes, in the housing 7, a plurality of power semiconductor elements 1, a substrate 3 configured to control and drive the power semiconductor elements 1, and a support case 4, to which a DC input terminal 4a and an AC output terminal 4b are attached. The DC input terminal 4a and the AC output terminal 4b are to be electrically connected to power semiconductor elements 1.

The plurality of power semiconductor elements 1 are arranged on the upper surface 2a of the heat sink 2. Relay terminals 1a extending upward from the power semiconductor elements 1 are electrically connected to the substrate 3 arranged above the power semiconductor elements 1. Further, on the upper surface 2a of the heat sink 2, a support case 4 is arranged, in which bus bar 4c are formed by insert molding. The bus bar 4c serves to electrically connect the DC input terminal 4a and each of the power semiconductor elements 1 as well as to electrically connect each of the power semiconductor elements 1 and the AC output terminal 4b. In addition, a metal plate 20 is arranged above the support case 4 so as to shield the substrate 3 against magnetic noise generated from the power semiconductor elements 1 so that a circuit on the substrate 3 is free from the noise.

A smoothing capacitor 5 covered by a case member 5b is arranged above the substrate 3 across an interval. Further, the support case 4, to which the DC input terminal 4a and the AC output terminal 4b are attached, is arranged below the substrate.

The smoothing capacitor 5 is electrically connected to the DC input terminal 4a via a bus bar 5a extending downward from an open end 5e on a lower side of the case member 5b. The bus bar 5a and the DC input, terminal 4a are fixed to the support case 4 by means of a screw 6a. Further, a ground bus bar terminal 5f of a Y capacitor incorporated in the smoothing capacitor 5 is fixed to a corresponding boss portion 2b together with a corresponding leg portion 5d by means of a corresponding screw 6b.

The case member 5b of the smoothing capacitor 5 has, on a side surface thereof, a plurality of leg portions 5d. The plurality of leg portions 5d are formed integrally with the case member 5b. Also, each leg portion 5d has a metal collar 5c that is formed by insert molding. The heat sink 2 has a plurality of the boss portions 2b extending from the upper surface 2a of the heat sink 2 to the smoothing capacitor 5. The plurality of leg portions 5d of the smoothing capacitor 5 are fixed to the plurality of boss portions 2b by means of the screws 6b in a one-to-one correspondence. As described above, the smoothing capacitor 5 is fixed to the plurality of boss portions 2b extending from the heat sink 2, via the plurality of leg portions 5d of the case member 5b in which the smoothing capacitor 5 is accommodated. Thus, the smoothing capacitor 5 is not in contact with the housing 7.

When $\alpha h$ represents a linear expansion coefficient of each boss portion 2b, Lh is a height from the upper surface 2a of the neat sink 2 to a seat 2c of each boss portion, $\alpha s$ is linear expansion coefficients of the case member 5b and each leg portion 5d, Ls represents a length of each leg portion 5d extending from the case member 5b to each boss portion 2b, $\alpha r$ represents a linear expansion coefficient of the support case 4, Lr represents a distance from the upper surface 2a of the heat sink 2, on which the support case 4 is arranged, to a center 4e of a screw hole formed in the support case 4, $\alpha b$ represents a linear expansion coefficient of the bus bar 5a, and Lb represents a distance from the open end 5e of the case member 5b to the center 4e of the screw hole, materials and dimensions for each boss portion, each leg portion, the support case, and the bus bar are determined so that a value of $(\alpha h \times Lh + \alpha s \times Ls)/(\alpha r \times Lr + \alpha b \times Lb)$ falls within a range of from 0.9 to 1.1.

For example, the support case 4, and the case member 5b and each leg portion 5d are made of a PPS resin (polyphenylene sulfide resin) having a linear expansion coefficient of $20 \times 10^{-6}$ (1/K), and the heat sink 2 and each boss portion 2b are made of ADC12 (aluminum die cast) having a linear expansion coefficient of $21 \times 10^{-6}$ (1/K). Further, the bus bar 5a of the smoothing capacitor 5 is made of aluminum having a linear expansion coefficient of from $23 \times 10^{-6}$ (1/K) to $24 \times 10^{-6}$ (1/K), and each collar 5c and each screw 6b are made of iron having a linear expansion coefficient of from $11 \times 10^{-6}$ (1/K) to $12 \times 10^{-6}$ (1/K).

In this case, linear expansion coefficients of the individual components satisfy a relationship of $\alpha r$ (support, case 4)=$\alpha s$ (case member 5b and leg portion 5d)<$\alpha h$ (boss portion 2b)<$\alpha b$ (bus bar 5a). Hence, in order to keep a balance with an expansion/contraction amount of the bus bar 5a, the length Ls of each leg portion 5d is required to be decreased and the height Lh of each boss portion 2b is required to be increased. With this setting, a vibration resistance and a cooling/heating cycle stability are both ensured. Further, the ground bus bar terminal 5f of the Y capacitor becomes short, and hence noise of the smoothing capacitor 5 can be released to the heat sink 2 on a ground side at nigh efficiency, leading to noise reduction.

In addition, the materials for each collar 5c and each screw 6b are selected so as to have the same linear expansion coefficient, by which an expansion/contraction amount of each collar 5c matches that of each screw 6b during a cooling/heating cycle. Consequently, the screws 6b are less loosened.

In FIG. 1, although the ground bus bar terminal 5f of the Y capacitor incorporated in the smoothing capacitor 5 is fixed to a corresponding boss portion 2b together with a corresponding leg portion 5d, the ground bus bar terminal 5f alone can be fixed to the corresponding boss portion 2b.

As described above, according to the power conversion device 100 of the first embodiment, dimensions of the individual components are determined so that a value of ("thermal expansion amount of each boss portion"+"thermal expansion amount of each leg portion")/("thermal expansion amount of the support case"+"thermal expansion amount of the bus bar") falls within a range of from 0.9 to 1.1. With this setting, even when the smoothing capacitor 5 reaches a high temperature and a corresponding leg portion 5d of the case member 5b of the smoothing capacitor 5 elongates toward the heat sink 2 side, stress is less likely to concentrate on the leg portion 5d, to thereby prevent a fatigue fracture of the leg portion 5d and also prevent the screw 6b from loosening.

Further, when a vehicle drives through a puddle of water with the power conversion device 100 being at high temperature, there is a risk of the metal housing 7 being rapidly cooled by a large quantity of splashed water. In this case, a difference in thermal shrinkage amount between the housing 7 and the smoothing capacitor 5 is further increased due to a difference in thermal transfer coefficient and a difference in heat capacity in addition to the difference in linear expansion coefficient between the housing 7 and the smoothing capacitor 5.

Even in such circumstances, according to the power conversion device 100 of the first embodiment, the smoothing capacitor 5 is supported so as not to come into contact with the housing 7, and hence the smoothing capacitor 5 is not rapidly cooled. It is therefore possible to avoid such a situation that the smoothing capacitor 5 is rapidly cooled, to thereby cause stress concentration in between the leg portions 5d, a fatigue fracture of the leg portions 5d, and loosening of the screw 6b.

Further, the smoothing capacitor 5 is not fixed to the housing 7, and hence the housing 7 can be prepared by processing a metal sheet. This configuration allows reduction in weight and processing cost of the housing 7. As another effect of the configuration described above, vibrations generated during the operation of the smoothing capacitor 5 do not directly propagate to the housing 7, and consequently the operation noise, generated by the smoothing capacitor 5, rarely leaks to an outside of the housing 7.

Moreover, even when the smoothing capacitor 5 reaches high temperature due to high-load running after cold start, and the smoothing capacitor 5 and the heat sink 2 thus have a large difference of thermal expansion amount in a horizontal direction, the boss portions 2b extending from the upper surface 2a of the heat sink 2 to the smoothing capacitor 5 warp, to thereby relax stress applied to the leg portions 5d. Accordingly, it is possible to prevent the fatigue fracture of the leg portions 5d and loosening of the screw 6b.

In addition, each boss portion 2b is formed so as to protrude from the upper surface 2a of the heat sink 2 so that a female thread portion formed by machining in the boss portion 2b does not interfere with the cooling water passage 2e of the heat sink 2. With this arrangement, the number of boss portions 2b and the layout thereof can be freely selected. In addition, owing to the large thickness of each boss portion 2b, each boss portion 2b can have a rigidity nigh enough to ensure both of a vibration resistance and a cooling/heating cycle stability.

In FIG. 1, the seat 2c of each boss portion 2b is located at a position lower than the open end 5e of the case member 5b, but the position is not limited thereto. For example, the length Ls of each leg portion 5d may be set to zero so that the seat 2c of each boss portion 2b is located above the open end 5e of the case member 5b.

Figure 2:
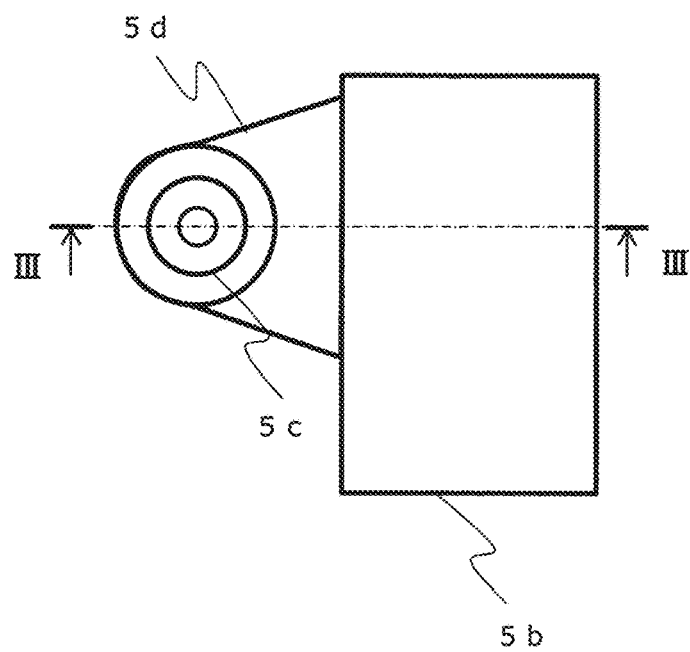
FIG. 2 is a top view for illustrating a modification example of a leg portion in the first embodiment.
Figure 3:
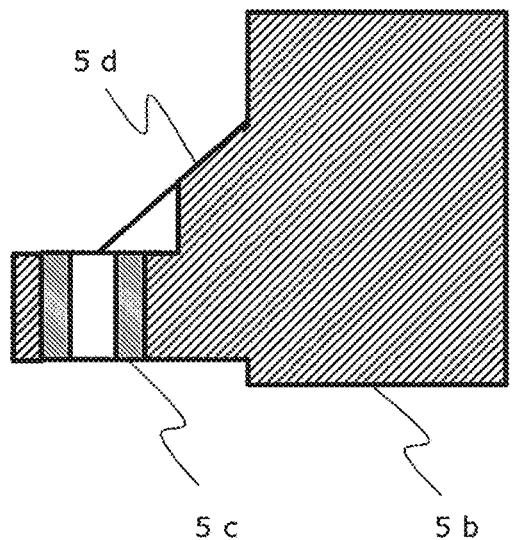
FIG. 3 is a sectional view taken along the line III-III of FIG. 2.

Further, in FIG. 1, each leg portion 5d is formed into an L shape but the shape is not limited thereto. FIG. 2 is a top view for illustrating a modification example of the leg portion 5d. FIG. 3 is a sectional view taken along the line III-III of FIG. 2. For example, as illustrated in FIG. 2 and FIG. 3, the leg portion 5d is formed so that a thickness of a connection portion between the leg portion 5d and the case member 5b is increased from the leg portion 5d toward the case member 5b. The leg portion 5d thus shaped reinforces a side wall of the case member 5b. With this configuration, deformation and the fatigue fracture of each leg portion 5d can be suppressed.

Second Embodiment

Figure 4:
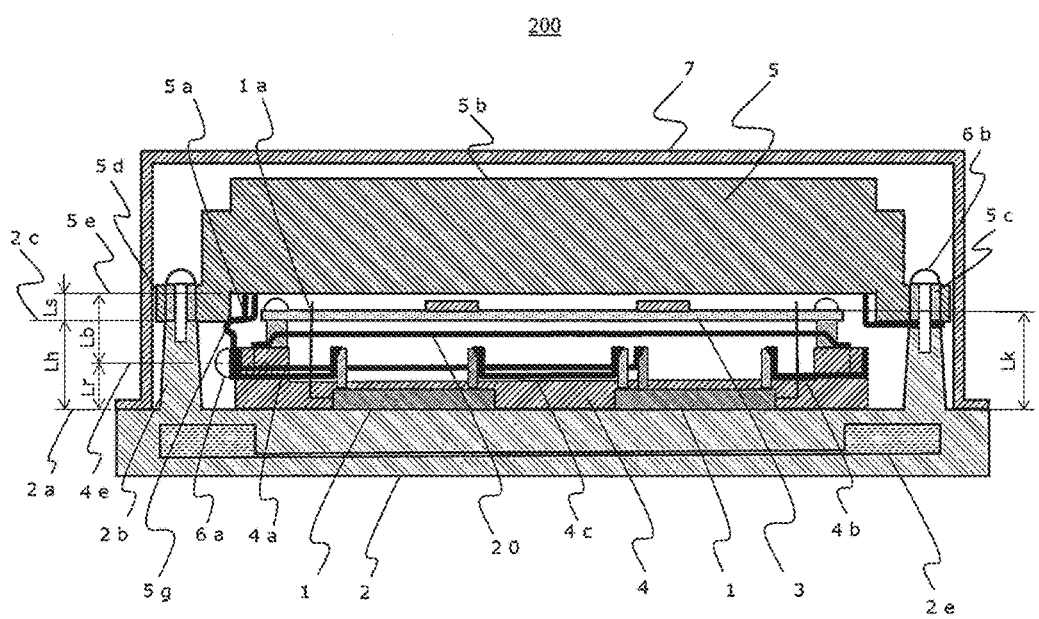
FIG. 4 is a vertical sectional view for illustrating a power conversion device according to a second embodiment of the present invention.

FIG. 4 is a view for illustrating a power conversion device 200 according to a second embodiment of the present invention. The power conversion device 200 of the second embodiment differs from that of the first embodiment in that the bus bar 5a of the smoothing capacitor 5 has a bent portion 5g. Other components are similar to those of the first embodiment.

As illustrated in FIG. 4, in the power conversion device 200 of the second embodiment, the bus bar 5a used to connect the smoothing capacitor 5 and the DC input terminal 4a, is formed with a plate thickness of 1.8 mm so as to have a bent portion 5g.

In the power conversion device 200, the temperatures of the smoothing capacitor 5 and the support case 4 rise during a high-load operation after startup, leading to a large temperature difference with the heat sink 2. In this case, a large difference occurs between a total thermal expansion amount of each boss portion 2b and each leg portion 5d and a total amount of the support case 4 and the bus bar 5a, with the result that the bus bar 5a is elongated, to thereby apply stress to the leg portions 5d.

Even in such a case, according to the power conversion device 200 of the second embodiment, the bus bar 5a is formed to have a small plate thickness so as to have the bent portion 5g, and the thermal expansion amount, of the bus bar 5a can thus be covered by the bent portion 5g. With this configuration, a load on each leg portion 5d can be reduced. Moreover, the screw 6a used to fix the bus bar 5a to the support case 4 can be less loosened.

Further, as illustrated in FIG. 4, according to the power conversion device 200 of the second embodiment, when Lk represents a distance from the upper surface 2a of the heat sink 2 to an upper surface corresponding to a mounting surface of the substrate 3, a relationship of Lh<Lk is established between the distance Lk and the height Lh from the upper surface 2a of the heat sink 2 to the seat 2c of each boss portion. As a result, the mounting surface of the substrate 3 is located at a position higher than the seat 2c of each boss portion 2b. Thus, in a step of soldering the relay terminals 1a of the power semiconductor elements 1 to the substrate 3, the length of a nozzle zig for partial spraying can be reduced to thereby improve solderability.

Third Embodiment

Figure 5:
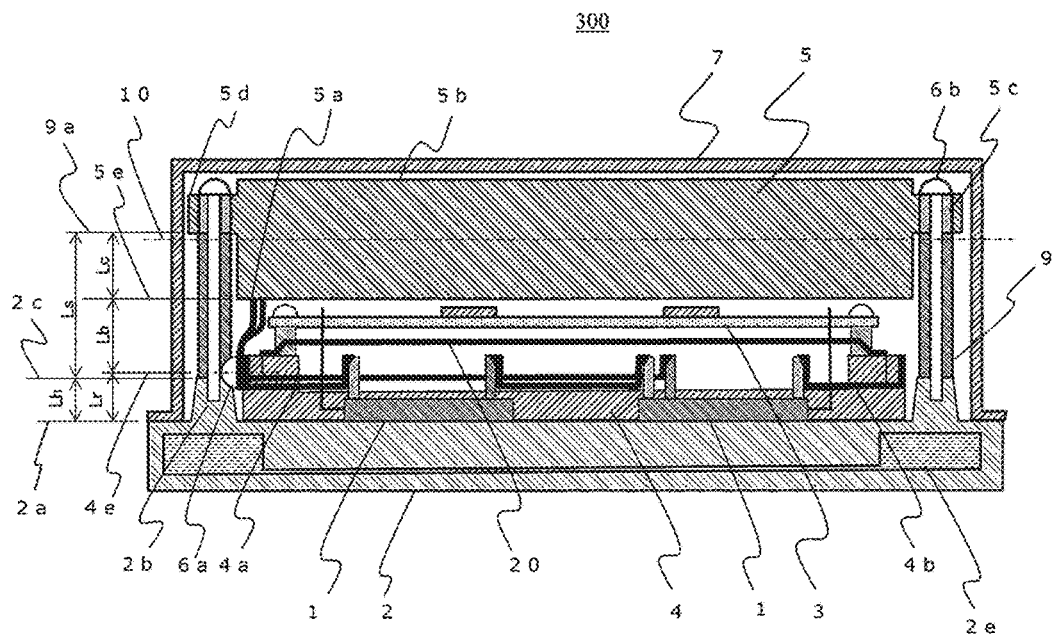
FIG. 5 is a vertical sectional view for illustrating a power conversion device according to a third embodiment of the present invention.

FIG. 5 is a view for illustrating a power conversion device 300 according to a third embodiment of the present invention. The power conversion device 300 of the third embodiment differs from that of the first embodiment in that a metal interstage sleeve 9 is arranged between each leg portion 5d of the case member 5b and each boss portion 2b. Other components are similar to those of the first embodiment.

As illustrated in FIG. 5, in the power conversion device 300 of the third embodiment, a corresponding leg portion 5d of the case member 5b of the smoothing capacitor 5 is fixed to a corresponding boss portion 2b extending from the heat sink 2 via a corresponding metal interstage sleeve 9.

Thus, in the thus-configured power conversion device 300 of the third embodiment, when $\alpha h$ represents a linear expansion coefficient of each boss portion 2b, Lh is a height from the upper surface 2a of the heat sink 2 to the seat 2c of each boss portion, $\alpha s$ represents a linear expansion coefficient of each interstage sleeve 9, Ls represents a length of each interstage sleeve 9, $\alpha r$ represents a linear expansion coefficient of the support case 4, Lr represents a distance from the upper surface 2a of the heat sink 2 to the center 4e of the screw hole of the support case 4, $\alpha b$ represents a linear expansion coefficient of the bus bar 5a, Lb represents a distance from the open end 5e of the case member 5b to the center 4e of the screw hole, Lc represents a distance from the open end 5e of the case member 5b to a contact surface 9a between the collar 5c of each leg portion 5d and each interstage sleeve 9, and $\alpha c$ represents a linear expansion coefficient of a casting resin to be filled into the case member 5b, materials and dimensions of each boss portion, each interstage sleeve, the support case, and the bus bar are determined so that a value of $(\alpha h \times Lh + \alpha s \times Ls)/(\alpha r \times Lr + \alpha b \times Lb + \alpha c \times Lc)$ falls within a range of from 0.9 to 1.1.

For example, the support case 4, and the case member 5b and each leg portion 5d are made of the PPS resin (polyphenylene sulfide resin) having the linear expansion coefficient of $20 \times 10^{-6}$ (1/K) and the heat sink 2 and each boss portion 2b are made of ADC12 (aluminum die cast) having the linear expansion coefficient of $21 \times 10^{-6}$ (1/K). Further, the bus bar 5a of the smoothing capacitor 5 is made of aluminum having the linear expansion coefficient of from $23 \times 10^{-6}$ (1/K) to $24 \times 10^{-6}$ (1/K), and each interstage sleeve is made of brass having a linear expansion coefficient of $20.8 \times 10^{-6}$ (1/K).

In this case, the linear expansion coefficients of the individual components satisfy a relationship of $\alpha r$(support case 4, case member 5b, and leg portion 5d)$\approx \alpha s$(interstage sleeve 9)<$\alpha h$(boss portion 2b)<$\alpha b$(bus bar 5a). Thus, in order to keep a balance with the expansion/contract ion amount of the bus bar 5a, it is required to increase the length Ls of each interstage sleeve 9 or the height Lh of each boss portion 2b.

However, the boss portions 2b are formed by cast molding and therefore limited in terms of formable height and shape due to a structure and draft of a mold. In contrast, the interstage sleeves 9, which are formed by cutting or drawing metal, have some degree of freedom in shape. Thus, in the power conversion device 300 of the third embodiment, the long interstage sleeve 9 is inserted between each leg portion 5d and each boss portion 2b so as to reduce the height of each boss portion 2b. This arrangement, allows improvement in moldability of the heat sink 2 that is produced integrally with the boss portions 2b, and allows downsizing of the mold so that a molding cost can be reduced and both of a vibration resistance and a cooling/heating cycle stability can be obtained with ease.

Note that, in the power conversion device 300 of the third embodiment, the bus bar 5a of the smoothing capacitor 5 is made of aluminum having a linear expansion coefficient of from $23 \times 10^{-6}$ (1/K) to $24 \times 10^{-6}$ (1/K), and each interstage sleeve 9 is made of brass having a linear expansion coefficient of $20.8 \times 10^{-6}$ (1/K), but the materials thereof are not limited thereto. For example, the bus bar 5a of the smoothing capacitor 5 may be made of oxygen-free copper having a linear expansion coefficient of $17.6 \times 10^{-6}$ (1/K), and each interstage sleeve 9 may be made of SUS304 having a linear expansion coefficient of $17.3 \times 10^{-6}$ (1/K).

Figure 6:
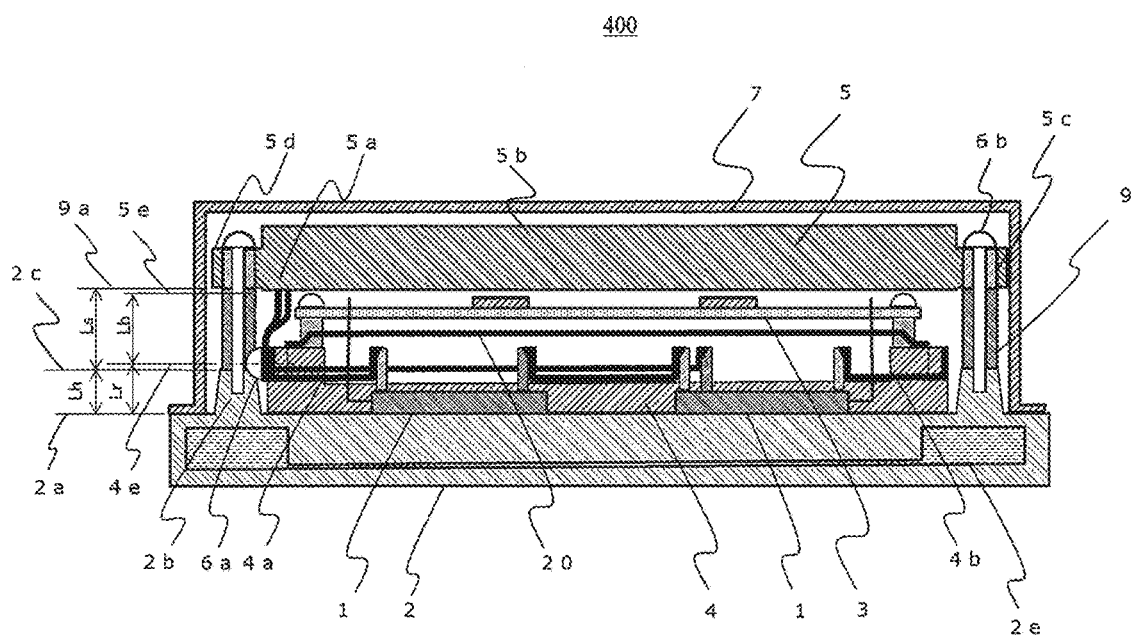
FIG. 6 is a view for illustrating a first modification example of the power conversion device according to the third embodiment.

The bus bar 5a and the interstage sleeves 9 are formed of materials having almost the same linear expansion coefficient so as not to have a difference in expansion/contraction amount therebetween. With this configuration, as in a power conversion device 400 according to a first modification as illustrated in FIG. 6, the bus bar 5a and each interstage sleeve 9 can have the same length.

Figure 7:
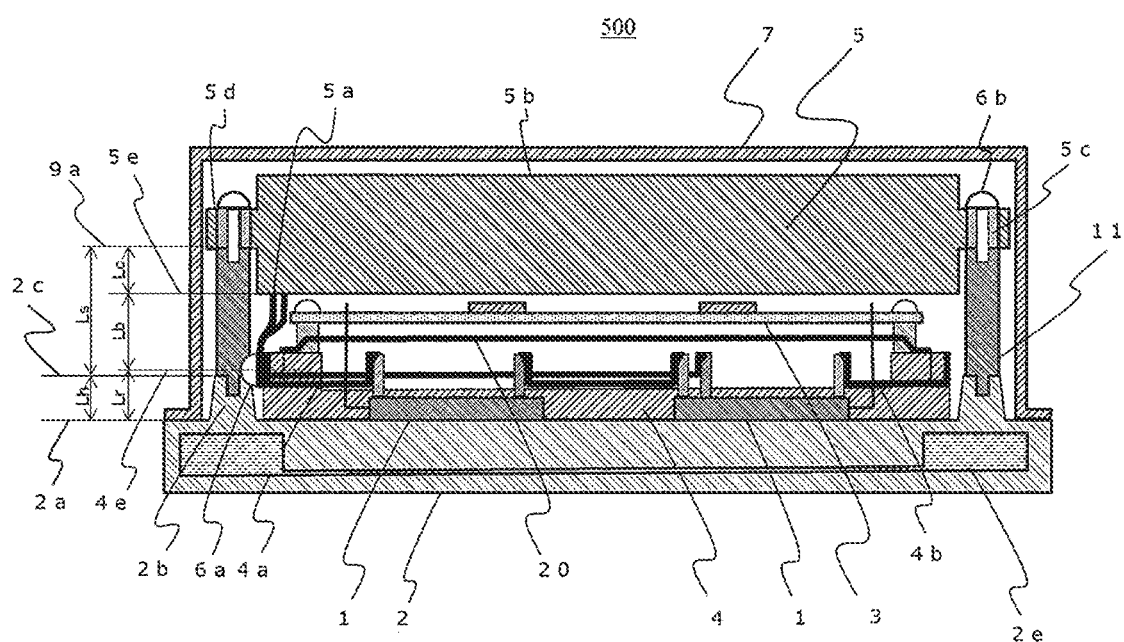
FIG. 7 is a view for illustrating a second modification example of the power conversion device according to the third embodiment.

Further, in the power conversion device 300 of the third embodiment, the interstage sleeve 9 is inserted between each leg portion 5d and each boss portion 2b, but the configuration is not limited thereto. For example, as in a power conversion device 500 in a second modification example as illustrated in FIG. 7, extension screws 11 may be used instead of the interstage sleeves 9. With the extension screws 11, it is not required to hold the interstage sleeves 9 during assembly of the power conversion device 500, to thereby facilitate the assembly.

Moreover, when the screw 6b is formed of inexpensive iron having a linear expansion coefficient of from $11 \times 10^{-6}$ (1/K) to $12 \times 10^{-6}$ (1/K), the linear expansion coefficient of the interstage sleeves 9 is at least 1.7 times higher than that of the screw 6b. As a result, the load is applied onto the seat 2c of each boss portion 2b, and, in some cases, a corresponding screw 6b is loosened. Even in such a case, in the power conversion device 500 of FIG. 5, the screw 6b can be less loosened through use of the extension screws 11 having a linear expansion coefficient equivalent to that of the screws 6b instead of the interstage sleeves 9 of the power conversion device 300.

Further, the inner diameter of each interstage sleeve 9 may be set smaller than that of each collar 5c. With this setting, when each collar 5c and each interstage sleeve 9 move in opposing directions with respect to the screw 6b, a contact area between each collar 5c and each interstage sleeve 9 can be less reduced. Thus, it is possible to suppress an increase in contact pressure at the contact surface 9a between the collar 5c of each leg portion 5d and each interstage sleeve 9, which occurs due to a difference in linear expansion coefficient between the screw 6b, the collar 5c, and the interstage sleeve 9, so as to prevent the screw 6b from loosening.

Figure 8:
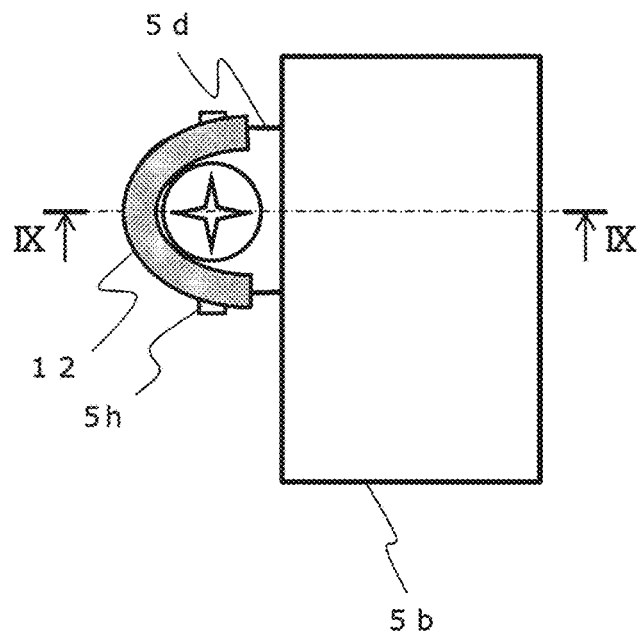
FIG. 8 is a top view for illustrating a modification example of an interstage sleeve in the third embodiment.
Figure 9:
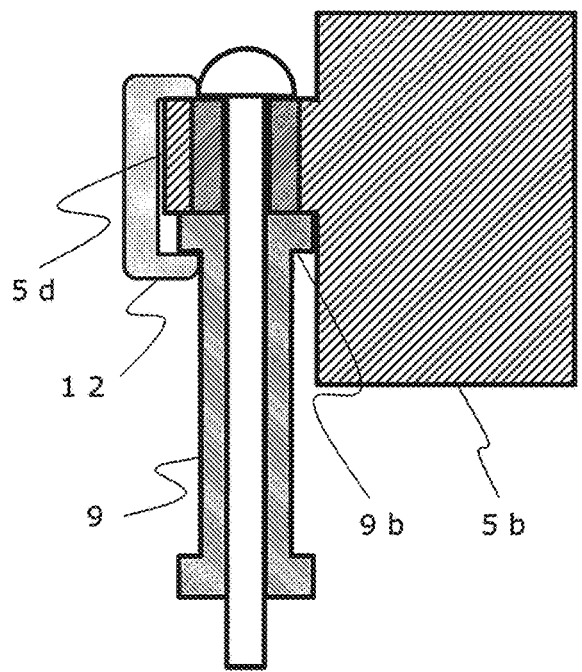
FIG. 9 is a sectional view taken along the line IX-IX of FIG. 8.

Further, in the third embodiment, the interstage sleeves 9 each have a cylindrical shape, but the shape is not limited thereto. For example, the interstage sleeves 9 may each have a shape illustrated in FIG. 8 and FIG. 9. FIG. 8 is a top view for illustrating the leg portion 5d. FIG. 9 is a sectional view taken along the line IX-IX of FIG. 8.

As illustrated in FIG. 8 and FIG. 9, each interstage sleeve 9 is formed to have a flange portion 9b at an end portion thereof, and each leg portion 5d is formed to have a protrusion 5h. Then, as illustrated in FIG. 9, a clip 12 is engaged with the protrusion 5h of the leg portion 5d and the flange portion 9b of the interstage sleeve 9 while the screw 6b is being inserted in the leg portion 5d and the interstage sleeve 9. Then, the interstage sleeve 9 is temporarily fixed to the leg portion 5d. In this state, the leg portion 5d and the interstage sleeve 9 are fixed to the boss portion 2b of the heat sink 2. With this configuration, the smoothing capacitor 5 can be fixed to the heat sink 2 while the interstage sleeve 9 is being held to the leg port ion 5d during assembly of the power conversion device 300. Consequently, the assembly of the power conversion device 300 can be facilitated.

REFERENCE SIGNS LIST

1 power semiconductor element, 1*a* relay terminal, 2 heat sink, 2*a* upper surface, 2*b* boss portion, 2*c* seat, 2*e* cooling water passage, 3 substrate, 4 support case, 4*a* DC input terminal, 4*b* AC output terminal, 4*c* bus bar, 4*e* center of screw hole, 5 smoothing capacitor, 5*a* bus bar, 5*b* case member, 5*c* collar, 5*d* leg portion, 5*e* open end, 5*g* bent portion, 5*h* protrusion, 6*a*, 6*b* screw, 7 housing, 9 interstage sleeve, 9*a* contact surface, 9*b* flange portion, 10 center line, 11 extension screw, 12 clip, 20 metal plate, 100, 200, 300, 400 power conversion device

The invention claimed is:

1. A power conversion device comprising, in a housing:
power semiconductor elements;
a support case, to which a DC input terminal and an AC output terminal are attached, the DC input terminal and the AC output terminal being connected to the power semiconductor elements,
a heat sink, in which a plurality of boss portions are formed on an upper surface thereof, and to which the power semiconductor elements and the support case are attached;
a case member having a plurality of leg portions;
a smoothing capacitor accommodated in the case member; and
a bus bar configured to connect the smoothing capacitor and the DC input terminal,
the plurality of leg portions of the case member being respectively fixed to the plurality of boss portions of the heat sink,
wherein materials and dimensions of the respective boss portions, the respective leg portions, the support case, and the bus bar are determined so that a total thermal elongation amount of the respective boss portions and the respective leg portions falls within a range of from 0.9 to 1.1 relative to a total thermal elongation amount of the support case and the bus bar.

2. The power conversion device according to claim 1, wherein the bus bar has a bent portion at a position between the case member and a connection portion with the DC input terminal.

3. The power conversion device according to claim 1,
wherein linear expansion coefficients of the support case, and the case member and the respective leg portions are smaller than linear expansion coefficients of the heat sink and the respective boss portions, and
wherein the linear expansion coefficients of the heat sink and the respective boss portions are smaller than a linear expansion coefficient of the bus bar.

4. The power conversion device according to claim 3,
wherein the support case, the case member, and the respective leg portions are made of a PPS resin,
wherein the heat sink and the respective boss portions are made of ADC12, and
wherein the bus bar is made of aluminum.

5. The power conversion device according to claim 1,
wherein the respective leg portions are formed integrally with the case member, and
wherein a thickness of the respective leg portions increases toward the case member.

6. A power conversion device comprising, in a housing:
power semiconductor elements;
a support case, to which a DC input terminal and an AC output terminal are attached, the DC input terminal and the AC output terminal being connected to the power semiconductor elements,
a heat sink, in which a plurality of boss portions are formed on an upper surface thereof, and to which the power semiconductor elements and the support case are attached;
a case member having a plurality of leg portions;
a smoothing capacitor accommodated in the case member; and
a bus bar configured to connect the smoothing capacitor and the DC input terminal,
the bus bar being attached to the DC input terminal by a screw, and
the plurality of leg portions of the case member being respectively fixed to the plurality of boss portions of the heat sink,
wherein materials and dimensions of the respective boss portions, the respective leg portions, the support case, and the bus bar are determined so that a value of $(\alpha h \times Lh + \alpha s \times Ls)/(\alpha r \times Lr + \alpha b \times Lb)$ falls within a range of from 0.9 to 1.1, where:
$\alpha h$ represents a linear expansion coefficient of the respective boss portions;
Lh represents a distance from the upper surface of the heat sink to a seat of the respective boss portions;
$\alpha s$ represents a linear expansion coefficient of the respective leg portions;
Ls represents a length of the respective leg portions extending from the case member to the respective boss portions;
$\alpha r$ represents a linear expansion coefficient of the support case;
Lr represents a distance from the upper surface of the heat sink to a center of a screw hole, into which the screw is inserted;
$\alpha b$ represents a linear expansion coefficient of the bus bar, and;
Lb represents a distance from an open end of the case member to the center of the screw hole.

7. The power conversion device according to claim 6, further comprising a substrate electrically connected to relay terminals of the power semiconductor elements,
wherein when Lk represents a distance from the upper surface of the heat sink to an upper surface of the substrate, a relationship of Lh<Lk is satisfied.

8. The power conversion device according to claim 6, wherein the bus bar has a bent portion at a position between the case member and a connection portion with the DC input terminal.

9. The power conversion device according to claim 6,
wherein linear expansion coefficients of the support case, and the case member and the respective leg portions are smaller than linear expansion coefficients of the heat sink and the respective boss portions, and
wherein the linear expansion coefficients of the heat sink and the respective boss portions are smaller than a linear expansion coefficient of the bus bar.

10. The power conversion device according to claim 6,
wherein the respective leg portions are formed integrally with the case member, and
wherein a thickness of the respective leg portions increases toward the case member.

11. A power conversion device comprising, in a housing:
power semiconductor elements;

a support case, to which a DC input terminal and an AC output terminal are attached, the DC input terminal and the AC output terminal being connected to the power semiconductor elements, a heat sink, in which a plurality of boss portions are formed on an upper surface thereof, and to which the power semiconductor elements and the support case are attached;

a case member having a plurality of leg portions;

a smoothing capacitor accommodated in the case member; and a bus bar configured to connect the smoothing capacitor and the DC input terminal, the plurality of leg portions of the case member each having an integrally formed collar, and the plurality of leg portions being respectively fixed to the plurality of boss portions of the heat sink via the collar and an intermediate member, wherein materials and dimensions of the respective boss portions, the intermediate member, the support case, and the bus bar are determined so that a total thermal elongation amount of the respective boss portions and the intermediate member falls within a range of from 0.9 to 1.1 relative to a total thermal elongation amount of the support case and the bus bar.

12. The power conversion device according to claim 11, wherein linear expansion coefficients of the support case, and the case member and the respective leg portions are smaller than a linear expansion coefficient of the intermediate member, wherein the linear expansion coefficient of the intermediate member is smaller than linear expansion coefficients of the heat sink and the respective boss portions, and wherein the linear expansion coefficients of the heat sink and the respective boss portions are smaller than a linear expansion coefficient of the bus bar.

13. The power conversion device according to claim 12, wherein the support case, the case member, and the respective leg portions are made of PPS, wherein the intermediate member is made of brass, wherein the heat sink and the respective boss portions are made of ADC12, and wherein the bus bar is made of aluminum.

14. The power conversion device according to claim 12, wherein the support case is made of PPS, wherein the intermediate member is made of SUS304, wherein the respective boss portions are made of ADC12, and wherein the bus bar is made of oxygen-free copper.

15. The power conversion device according to claim 11, wherein the intermediate member comprises an extension screw.

16. The power conversion device according to claim 11, wherein the intermediate member includes a sleeve.

17. The power conversion device according to claim 16, wherein a contact surface between the sleeve and the collar is located above a center line of the case member in a vertical direction.

18. The power conversion device according to claim 16, wherein an inner diameter of the sleeve is smaller than an inner diameter of the collar.

19. A power conversion device comprising, in a housing:

power semiconductor elements;

a substrate electrically connected to relay terminals of the power semiconductor elements, a support case, to which a DC input terminal and an AC output terminal are attached, the DC input terminal and the AC output terminal being connected to the power semiconductor elements, a heat sink, in which a plurality of boss portions are formed on an upper surface thereof, and to which the power semiconductor elements and the support case are attached;

a case member having a plurality of leg portions;

a smoothing capacitor accommodated in the case member; and a bus bar configured to connect the smoothing capacitor and the DC input terminal, the plurality of leg portions of the case member each having an integrally formed collar, the plurality of leg portions being respectively fixed to the plurality of boss portions of the heat sink via the collar and an intermediate member, the bus bar being attached to the support case by a screw, the case member having a plurality of leg portions each having a collar, and the plurality of leg portions of the case member being respectively fixed to seats of the plurality of boss portions via the collar and an intermediate member, wherein materials and dimensions of the respective boss portions, the intermediate member, the support case, and the bus bar are determined so that a value of $(\alpha h \times Lh + \alpha s \times Ls)/(\alpha r \times Lr + \alpha b \times Lb + \alpha c \times Lc)$ falls within a range of from 0.9 to 1.1, where:

$\alpha h$ represents a linear expansion coefficient of the respective boss portions;

Lh represents a distance from the upper surface of the heat sink to the seat of the respective boss portions;

$\alpha s$ represents a linear expansion coefficient of the intermediate member;

Ls represents a length of the intermediate member, ar represents a linear expansion coefficient of the support case;

Lr represents a distance from the upper surface of the heat sink to a center of a screw hole, into which the screw is inserted, $\alpha b$ represents a linear expansion coefficient of the bus bar;

Lb represents a distance from an open end of the case member to the center of the screw hole;

$\alpha c$ represents a linear expansion coefficient of a casting resin to be filled into the case member; and Lc represents a distance from the open end of the case member to a contact surface between the collar and the intermediate member.

* * * * *